(12) United States Patent
Shikata

(10) Patent No.: US 7,848,169 B2
(45) Date of Patent: Dec. 7, 2010

(54) SEMICONDUCTOR DEVICE

(75) Inventor: Takashi Shikata, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 300 days.

(21) Appl. No.: 12/137,069

(22) Filed: Jun. 11, 2008

(65) Prior Publication Data

US 2009/0147610 A1 Jun. 11, 2009

(30) Foreign Application Priority Data

Jun. 12, 2007 (JP) ............................. 2007-155525

(51) Int. Cl.
*G11C 5/14* (2006.01)
(52) U.S. Cl. ...................... 365/226; 365/194
(58) Field of Classification Search ................. 365/226, 365/194, 233.1
See application file for complete search history.

(56) References Cited

U.S. PATENT DOCUMENTS

| | | | |
|---|---|---|---|
| 5,917,761 A * | 6/1999 | Tietjen et al. ............... 365/194 |
| 6,314,040 B1 * | 11/2001 | Reynolds ..................... 365/226 |
| 6,912,139 B2 * | 6/2005 | Kernahan et al. ............. 363/41 |
| 2002/0048335 A1 * | 4/2002 | Saeki ......................... 375/371 |
| 2005/0283630 A1 | 12/2005 | Shikata |

FOREIGN PATENT DOCUMENTS

| JP | 2002-190747 A | 7/2002 |
|---|---|---|
| JP | 2006-4338 A | 1/2006 |

\* cited by examiner

*Primary Examiner*—Anh Phung
(74) *Attorney, Agent, or Firm*—Arent Fox LLP

(57) ABSTRACT

A semiconductor device includes first and second memory circuits that are disposed in different power source blocks and operate in synchronization with a clock, first and second delay circuits that are connected between output terminals of one memory circuits and input terminals of the other memory circuits, and a determination circuit that determines whether it is a situation that can cause malfunction based on an input signal and an output signal in the memory circuits and outputs a determination result as an error detection signal. To the first and second memory circuits, different initial values are given, and it is monitored whether a signal is sent and received between the memory circuits in a toggle state or not. Thus, occurrence of a situation that can cause malfunction can be simply and quickly detected.

10 Claims, 13 Drawing Sheets

SEMICONDUCTOR DEVICE

TECHNICAL FIELD

This is related to a semiconductor device that has a plurality of power source blocks in which operating voltages and operating frequencies can be controlled.

BACKGROUND

In recent years, as semiconductor devices (semiconductor integrated circuits) such as large-scale integrations (LSIs) are increased in speeds and sizes, reduction of power consumption in the semiconductor devices becomes a big problem. In the semiconductor devices, if a load capacity is C, a power supply voltage is V, and an operating frequency is F, generally, a power consumption P of the semiconductor devices is expressed as $P=C \times V^2 \times F$.

In view of the above, techniques for reducing power consumption of semiconductor devices have been applied to high-speed processors and various semiconductor devices are required to reduce their power consumption to low. The techniques are performed by dividing a chip into a plurality of power source blocks and controlling operating voltages and operating frequencies of the power source blocks.

The techniques for reducing the power consumption include a technique called a dynamic voltage frequency scaling (DVFS) that dynamically changes operating voltages and operating frequencies to a particular block, and a power gating control technique that controls on/off of power supply to a particular block.

However, to the particular block, if the power supply on/off control, the changing control of the operating voltages, the changing control of the operating frequencies, and the on/off control relating to the operating frequency are performed, noise can be generated in the power source or a ground in the semiconductor device, or the voltage can be temporarily decreased (for example, see FIG. 13). Further, in a normal operation where the operating voltage and the operating frequency are constant, due to simultaneous switching output noise (SSO noise) in changing outputs such as input/output (I/O) cells (input/output circuits) at once or the like, noise can be generated in the power source or the ground in the semiconductor device.

The power-supply noise or the temporary voltage reduction in the semiconductor device can affect the operation of the semiconductor device and may cause malfunction. Especially, in the semiconductor devices that have the chip divided into power source blocks, capacity of each power source block is small. Accordingly, the semiconductor devices are easily affected by the power-supply noise and the temporary voltage reduction.

For example, the malfunction in the semiconductor devices caused by large-amplitude noise in the power source or the ground or temporary voltage reduction includes destruction of data stored in a register or a memory, and timing error generation. Further, a phase locked loop (PLL) may be unlocked and supply clocks may transiently become unexpectedly high frequencies. Then, the semiconductor devices become unstable and can cause malfunction.

FIG. 13 is a view illustrating an example of inner voltage variation in a semiconductor device. In FIG. 13, the horizontal axis denotes time, CLK denotes clocks supplied to a CPU, CPUV denotes voltage levels of a power source block that includes the CPU, and OCBV denotes voltage levels of the power source block that includes an on-chip bus. For example, as illustrated in FIG. 13, if a frequency (operating frequency) of a clock to be supplied to the CPU is suddenly changed, as shown in a part surrounded by an ellipse 131 of a dotted line, power-supply noise or temporary voltage reduction is generated. Then, if data is being transferred between the CPU and the on-chip bus, a timing error may be generated and may cause malfunction.

In view of the above, to prevent the semiconductor device from being affected or to soften the ill effect, it is necessary to provide means for providing a hardware monitor circuit for monitoring an operation state in the semiconductor device. If the operation state becomes worse, the means prevents malfunction and if the malfunction occurs, the means recovers the semiconductor device.

As one example of the means, it is proposed a technique for performing a power-supply voltage control corresponding to change in internal temperature or process variation in a monitor circuit using a ring oscillator. However, in monitoring the operation state using the ring oscillator, if a predetermined period for measuring a count value using the ring oscillator has not passed, it is not possible to determine the operation state of the semiconductor device. Accordingly, for example, it is difficult to immediately correspond to the change in the operation state due to a sudden operation deterioration factor such as power-supply noise, temporary voltage reduction, or the like.

As techniques to detect such a sudden deterioration in the operation environment, it is proposed a method for determining the sudden deterioration based on whether a test circuit that has a predetermined delay value in a particular clock cycle operates or not (for example, see Japanese Laid-open Patent Publication No. 2002-190747 and Japanese Laid-open Patent Publication No. 2006-4338). However, for the semiconductor devices that have the chip divided into the power source blocks, appropriate methods for detecting malfunction occurred between the power source blocks or the like due to power-supply noise, temporary voltage reduction, or the like at a high speed have been desired.

SUMMARY OF THE INVENTION

According to one aspect of the embodiments, a semiconductor device includes first and second memory circuits that are disposed in different power source blocks and operate in synchronization with a clock.

A semiconductor device includes first and second delay circuits that are connected between output terminals of one memory circuits and input terminals of the other memory circuits, and a determination circuit that determines whether it is a situation that can cause malfunction based on an input signal and an output signal in the memory circuits and outputs a determination result as an error detection signal.

DESCRIPTION OF THE PREFERRED EMBODIMENTS

Hereinafter, embodiments will be described with reference to the drawings.

Figure 1:
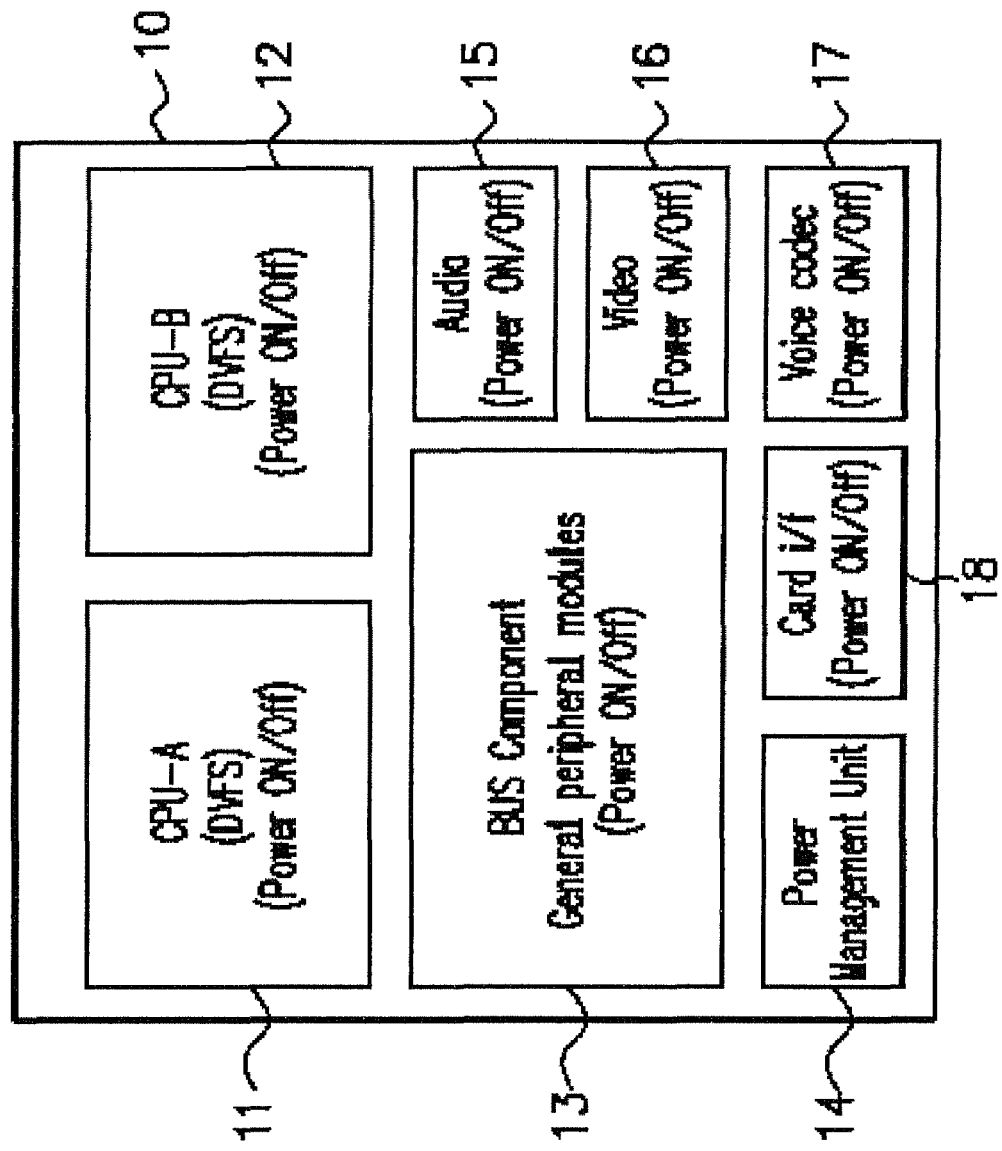
FIG. 1 is a view illustrating an example of a configuration of a semiconductor device to which embodiments are applied.

FIG. 1 is a view illustrating an example of a configuration of a semiconductor device (for example, LSI) to which embodiments of are applied. In a semiconductor device 10 illustrated in FIG. 1, a chip is divided into power source blocks (power domains) 11 to 18. In each of the divided power source blocks, control (DVFS control, power gating control, etc.) relating power consumption can be performed.

The power source block 11 includes a circuit for realizing a function as a CPU core A. The power source block 12 includes a circuit for realizing a function as a CPU core B. The power source block 13 includes a bus (on-chip bus etc.) and universal peripheral circuits (memory controller, clock generation circuit, etc.).

The power source block 14 includes a circuit that performs a management control relating to power consumption such as a power supply control or a clock control in the semiconductor device 10. The power source blocks 15 to 18 include a circuit that performs an audio signal processing, a circuit that performs a video signal processing, a circuit that performs a voice encoding processing, and a circuit that performs a card interface control respectively.

To the power source blocks 11 and 12, the DVFS control and the power gating control are applied (both control techniques are applied). That is, in the power source blocks 11 and 12, corresponding to operation states, or the like, operating voltages and operating frequencies are dynamically changed and on/off control of power supply to the power source blocks 11 and 12 is performed.

To the power source blocks 13 and 15 to 18, the power gating control is applied (only the power gating control technique is applied). That is, in the power source blocks 13 and 15 to 18, corresponding to operation states, or the like, on/off control of power supply to the power source blocks 13 and 15 to 18 is performed respectively.

First Embodiment

Hereinafter, a first embodiment will be described.

As described above, in a case where the circuit for monitoring an operation state in the semiconductor device is realized using the ring oscillator or the like, it is possible to monitor a state averaged to some degree. However, it is difficult to detect malfunction due to an unexpected factor such as an instantaneous power-supply noise, voltage reduction, or the like, or occurrence of a situation that can cause the malfunction. Further, in a case where the detection circuit is formed using analog circuits to detect power-supply noise or the like, it is preferable that stable power-supply voltage without noise is supplied to the detection circuit. However, sometimes it may be difficult to provide the stable power-supply voltage because of limitations in layout or the like.

The semiconductor device according to the first embodiment is formed using only digital circuits. In the semiconductor device, a malfunction detection circuit that detects a situation that can cause malfunction due to factors including unexpected factors such as instantaneous power-supply noise or voltage change is provided. By providing the malfunction detection circuit, in the first embodiment, including the change in the operation state due to the unexpected factor such as instantaneous power-supply noise or the like, occurrence of the situation that can cause malfunction can be simply and quickly detected.

Figure 2:
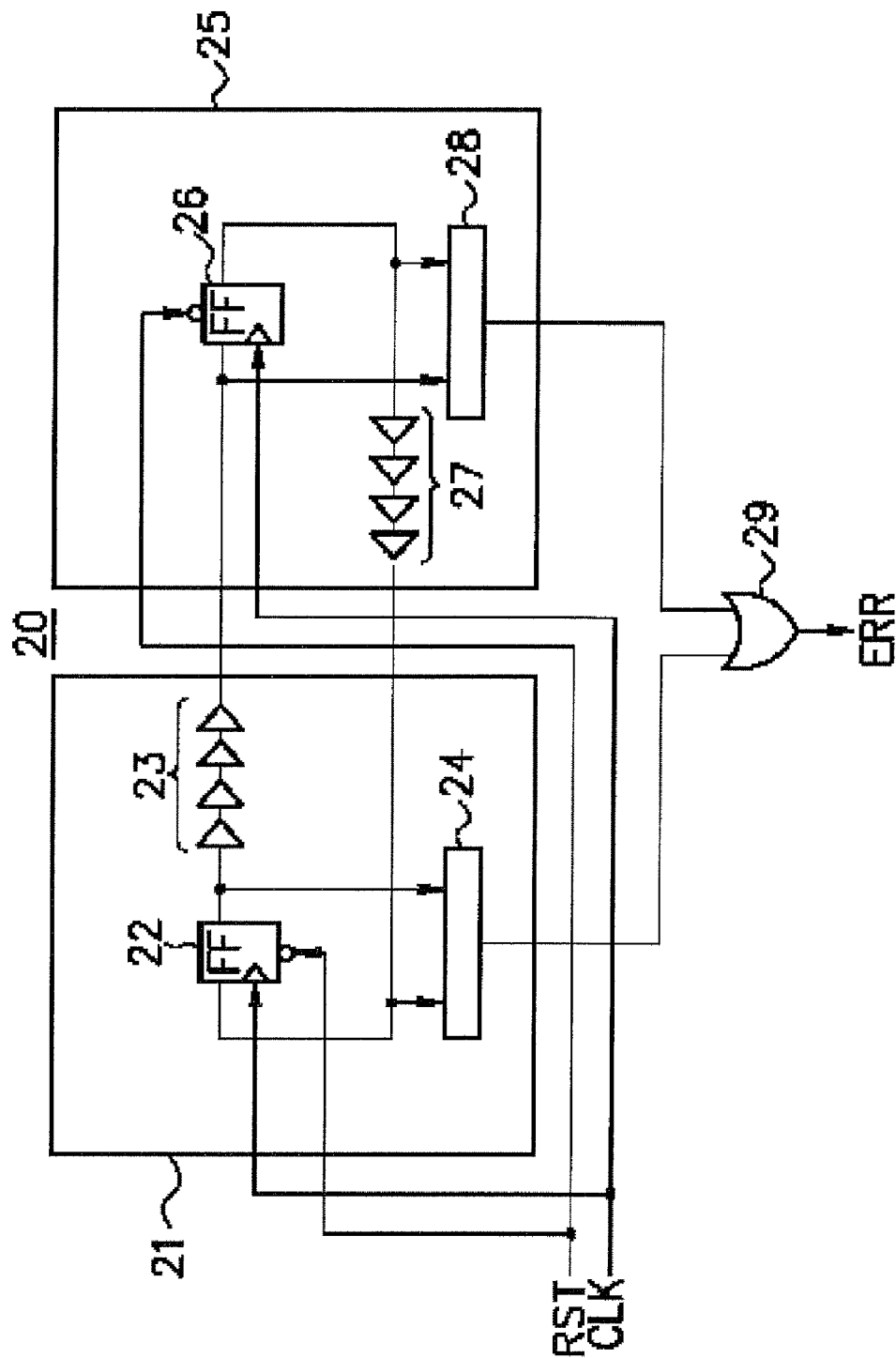
FIG. 2 is a view illustrating an example of a configuration of a malfunction detection circuit according to a first embodiment.

FIG. 2 is a view illustrating an example of a configuration of a malfunction detection circuit 20 provided in the semiconductor device according to the first embodiment. The malfunction detection circuit 20 includes a first monitor circuit 21, a second monitor circuit 25, and an error detection signal output circuit 29.

The first monitor circuit 21 is provided in a first power source block. The second monitor circuit 25 is provided in a second power source block that is a power source block different from the first power source block. For example, the first monitor circuit 21 is provided in the power source blocks 11 and 12 that realize functions as the CPU cores illustrated in FIG. 1. The second monitor circuit 25 is provided in the power source block 13 that has the bus (on-chip bus) and the universal peripheral circuits. The first power source block in which the first monitor circuit 21 is provided and the second power source block in which the second monitor circuit 25 is provided are not limited to the above, any power source block in the semiconductor device can be used.

The first monitor circuit 21 includes a memory circuit 22, a delay circuit 23, and a determination circuit 24. Similarly, the second monitor circuit 25 includes a memory circuit 26, a delay circuit 27, and a determination circuit 28. The memory circuits 22 and 26, the delay circuits 23 and 27, the determination circuits 24 and 28, and the error detection signal output circuit 29 are formed using digital circuits (digital elements). That is, the malfunction detection circuit 20 is formed using only the digital circuits (digital elements).

The memory circuits 22 and 26 operate (output) in synchronization with a clock signal CLK, and store and output an input signal (logical value). The memory circuits 22 and 26 are formed using, for example, flip-flops or latches. In the description below, it is assumed that the memory circuits 22 and 26 are formed using the flip-flops.

To the memory circuits 22 and 26, a reset signal RST is supplied. In a period the reset signal RST is asserted, predetermined initial values are output respectively. The memory circuits 22 and 26 output different initial values. For example, if the memory circuits 22 and 26 are formed using the flip-flops, by asserting the reset signal RST, one flip-flop can be reset and the other flip-flop can be preset.

The delay circuit 23 is connected between an output end of the memory circuit 22 and an input end of the memory circuit 26. The delay circuit 23 delays a signal transmitted form the output end of the memory circuit 22 to the input end of the memory circuit 26. The delay circuit 27 is connected between an output end of the memory circuit 26 and an input end of the memory circuit 22. The delay circuit 27 delays a signal transmitted form the output end of the delay circuit 26 to the input end of the memory circuit 22. The delay circuits 23 and 27 are formed, for example, by serially connecting a plurality of buffers (or an even number of inverters) for delaying for a period corresponding to a predetermined delay value.

The predetermined delay value by the delay circuits 23 and 27 may be, for example, a delay value corresponding to a worst value of a path delay between the first power source block where the first monitor circuit 21 is provided and the second power source block where the second monitor circuit 25 is provided, or a delay value corresponding to a delay value in a critical path in the chip. The worst value of the path delay and the delay value in the critical path can be obtained by a timing verification (simulation) at the time of design or the like. Further, as the predetermined delay value by the delay circuits 23 and 27, a predetermined additional time may be added to the delay value corresponding to the worst value in the path delay between the first power source block and the second power source block or the delay value corresponding to the delay value in the critical path in the chip.

In FIG. 2, as an example, the case of the delay circuits 23 and 27 formed of four serially-connected buffers respectively is illustrated. However, actually, the delay circuits 23 and 27 are formed using a plurality of buffers (or an even number of inverters) for realizing a necessary delay value.

The determination circuits 24 and 28 determine whether a situation that can cause malfunction can occur or not based on the input signals and the output signals in the memory circuits 22 and 26. Further, the determination circuits 24 and 28 output determination results to the error detection signal output circuit 29.

As will be described below, in the first embodiment, if it is not a situation that can cause malfunction (a normal operation is being realized), the input signals and the output signals in the memory circuits 22 and 26 are different with each other respectively. If the corresponding input signals and the output signals in the memory circuits 22 and 26 are different logical values, the determination circuits 24 and 28 determine that it is not the situation that can cause malfunction. If the corresponding input signals and the output signals are same logical values (the input signals correspond to the output signals), the determination circuits 24 and 28 determine that it is the situation that can cause malfunction.

The determination circuits 24 and 28 are formed, for example, using arithmetic circuits (Exclusive-NOR circuits: EX-NOR circuits) to which the corresponding input signals and output signals from the memory circuits 22 and 26 are input and perform logic operations exclusive-NOR. It is noted that the determination circuits 24 and 28 are not limited to the EX-NOR circuits, but any style may be employed if different signals can be output in the first state that the corresponding input signals and output signals in the memory circuits 22 and 26 are different logical values and the second state that the corresponding input signals and output signals are same logical values. The determination circuits 24 and 28 may be formed by appropriately combining a plurality of logic circuits so that a logic operation exclusive-NOR is realized.

Now, an operation of the malfunction detection circuit 20 is described.

First, in a reset state where a reset signal RST is asserted, the memory circuits 22 and 26 output different initial values. Then, if the reset signal RST is negated and the reset states in the memory circuits 22 and 26 are released at the same time, an operation synchronized with a clock signal CLK is started.

In the operation, in a case where it is not a situation that can cause malfunction (a normal operation is being realized), between the memory circuits 22 and 26, a signal is send and received in a toggle state (a toggle signal is send and received).

Then, if a state that can cause malfunction due to factors such as instantaneous power-supply noise, voltage reduction, or the like by a clock gear switching (change in operating frequencies), an operating voltage change, or an on/off control in power supply to a predetermined power source block occurs, the delay amount by the delay circuits 23 and 27 is increased as compared to the case the normal operation is being performed. In the state, the delay amount between the delay circuits 22 and 26 exceeds a clock period, and the toggle state of the signal send and received between the memory circuits 22 and 26 is lost. Accordingly, at least one of the memory circuits 22 and 26, the input signal and the output signal have same logical values.

Further, based on the state that the input signal and the output signal have the same logical values in at least one of the memory circuits 22 and 26, it is determined that it is the situation that can cause malfunction detected by the determination circuits 24 and 28. The determination result is supplied to the error detection signal output circuit 29, and the occurrence of the situation that can cause malfunction is output as an error detection signal ERR.

As described above, using the malfunction detection circuit 20 that is formed using only the digital circuits, including the unexpected factors such as instantaneous power-supply noise, voltage reduction, or the like, the occurrence of the situation that can cause the malfunction can be effectively, simply, and quickly detected and notified by the error detection signal ERR.

Figure 3:
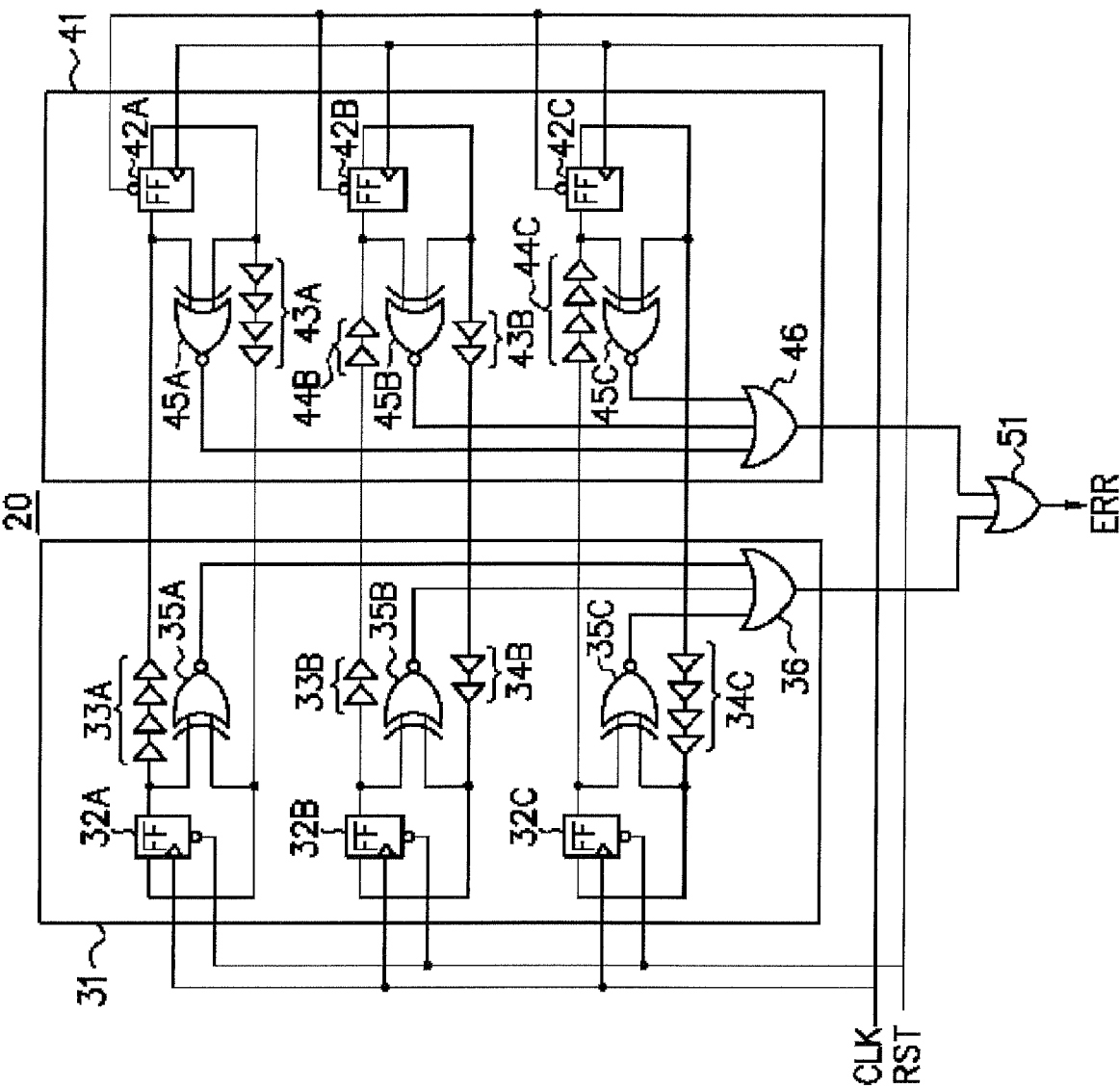
FIG. 3 is a view illustrating an another example of the configuration of the malfunction detection circuit according to the first embodiment.

FIG. 3 is a view illustrating another example of the configuration of the malfunction detection circuit 20 according to the first embodiment. In the malfunction detection circuit 20 illustrated in FIG. 2, between the memory circuits 22 and 26, the signal is send and received in the toggle state. However, depending on circuit elements such as transistors, delay amounts may vary in rising and fall time of the signal. Further, depending on the power source blocks, effects by the voltage reduction, power-supply noise, or the like may vary.

In view of the above, in the malfunction detection circuit 20 in FIG. 3, a plurality of the malfunction detection circuits illustrated in FIG. 2 are provided. Further, the circuit elements forming the delay circuits are disposed in each power source block (power domain) such that the occurrence of the situation that can cause malfunction can be further surely detected. It is preferable that the circuit elements forming the delay circuits are disposed such that the arrangements are different with each other in each set forming the malfunction detection circuits.

In FIG. 3, reference numeral 31 denotes the first monitor circuit, reference numeral 41 denotes the second monitor circuit, and reference numeral 51 denotes the error detection signal output circuit. The first monitor circuit 31 is provided in the first power source block (for example, the power source blocks 11 and 12 in FIG. 1), and the second monitor circuit 41 is provided in the second power source block (for example, the power source block 13 in FIG. 1) that is different from the first power source block.

The first monitor circuit 31 includes memory circuits 32A, 32B, and 32C, delay circuits 33A, 33B, 34B, and 34C, determination circuits (EX-NOR circuits) 35A, 35B, and 35C, and a logic operation OR circuit (OR circuit) 36. The second monitor circuit 41 includes memory circuits 42A, 42B, and 42C, delay circuits 43A, 43B, 44B, and 44C, determination circuits (EX-NOR circuits) 45A, 45B, and 45C, and a logic operation OR circuit (OR circuit) 46.

The memory circuit 32A, the delay circuit 33A, and the determination circuit 35A in the first monitor circuit 31 and the memory circuit 42A, the delay circuit 43A, and the determination circuit 45A in the second monitor circuit 41 form a circuit corresponding to the malfunction detection circuit in FIG. 2. The memory circuit 32B, the delay circuits 33B and 34B, and the determination circuit 35B in the first monitor circuit 31 and the memory circuit 42B, the delay circuits 43B and 44B, and the determination circuit 45B in the second monitor circuit 41 form a circuit corresponding to the malfunction detection circuit in FIG. 2. Further, the memory circuit 32C, the delay circuit 34C, and the determination circuit 35C in the first monitor circuit 31 and the memory circuit 42C, the delay circuit 44C, and the determination circuit 45C in the second monitor circuit 41 form a circuit corresponding to the malfunction detection circuit in FIG. 2.

That is, the malfunction detection circuit 20 in FIG. 3 is an example that three malfunction detection circuits illustrated in FIG. 2 are provided. In the three circuits, in two malfunction detection circuits, the circuit elements forming the delay circuits between the memory circuits are disposed near the output ends or the input ends in the memory circuits in the monitor circuits 31 and 32 respectively, and in the one malfunction detection circuit, the circuit elements forming the delay circuit between the memory circuits are divided and disposed in the monitor circuits 31 and 32 respectively.

It is designed such that the delay amount by the delay circuit 33A, the delay amount by the delay circuits 33B and 44B, and the delay amount by the delay circuit 44C are equal to each other. Similarly, it is designed such that the delay amount by the delay circuit 43A, the delay amount by the delay circuits 43B and 34B, and the delay amount by the delay circuit 34C are equal to each other.

Similarly to the malfunction detection circuit 20 in FIG. 2, the malfunction detection circuit 20 illustrated in FIG. 3 starts an operation synchronized with a clock signal CLK if reset signal RST are negated and reset states are released at the same time. At the time, in a case where it is not a situation that can cause malfunction (a normal operation is being realized), in the three circuits corresponding to the malfunction detection circuit 20 in FIG. 2, a signal is send and received in a toggle state (a toggle signal is send and received).

Then, if a state that can cause malfunction due to factors such as instantaneous power-supply noise, voltage reduction, or the like occurs, and the determination circuits 35A to 35C, and 45A to 45C detect the occurrence, it is determined that it is the situation that can cause malfunction. If any one of the determination circuits 35A to 35C determines that it is the situation that can cause malfunction, the determination result is supplied to an error detection signal output circuit 51 via the OR circuit 36, and the occurrence of the situation that can cause malfunction is output as an error detection signal ERR. Similarly, if any one of the determination circuits 45A to 45C determines that it is the situation that can cause malfunction, the determination result is supplied to the error detection signal output circuit 51 via the OR circuit 46, and the occurrence of the situation that can cause malfunction is output as an error detection signal ERR.

In FIG. 3, as one example, the case that the three malfunction detection circuits illustrated in FIG. 2 are provided is illustrated. However, it is not limited to the above, but any plurality of number of malfunction detection circuits in FIG. 2 may be provided and the circuit elements forming each delay circuit may be disposed in different patterns.

As described above, according to the malfunction detection circuit illustrated in FIG. 3, by the malfunction detection circuit that is formed using only the digital circuits, including the unexpected factors such as instantaneous power-supply noise, voltage reduction, or the like, the occurrence of the situation that can cause the malfunction can be effectively, simply, and quickly detected and notified by the error detection signal ERR. Further, by disposing the circuit elements forming the delay circuits such that the arrangements are different with each other in each combination, it is possible to detect the occurrence of the situation that can cause malfunction while variations in manufacturing of the transistors are considered.

Second Embodiment

Now, a second embodiment is described.

A semiconductor device according to the second embodiment performs a control to prevent occurrence of a situation that can cause malfunction in a case where the situation that can cause malfunction is detected using the malfunction detection circuit according to the above-described first embodiment. Hereinafter, it is described is an example that in the case where the situation that can cause malfunction is detected, a control is performed such that asynchronous data transfer is performed.

Generally, when data transfer via a bus is performed between power source blocks that have different operating voltages, the data transfer is performed via an asynchronous bus bridge, or the like. On the other hand, when the data transfer via a bus is performed between power source blocks that have the same operating voltages, the data transfer is performed without using the asynchronous bus bridge, or the like. In such a case, if the operating voltages of the power source blocks for performing the data transfer via the bus are the same, malfunction may occur due to instantaneous power-supply noise, voltage reduction, or the like.

To solve the problem, in the semiconductor device according to the second embodiment, if the situation that can cause malfunction is detected by the above-described malfunction detection circuit, in order to prevent the malfunction, the data transfer is switched to a data transfer via an asynchronous bus bridge. Thus, the malfunction due to the factors such as instantaneous power-supply noise, voltage reduction, or the like can be prevented.

Figure 4:
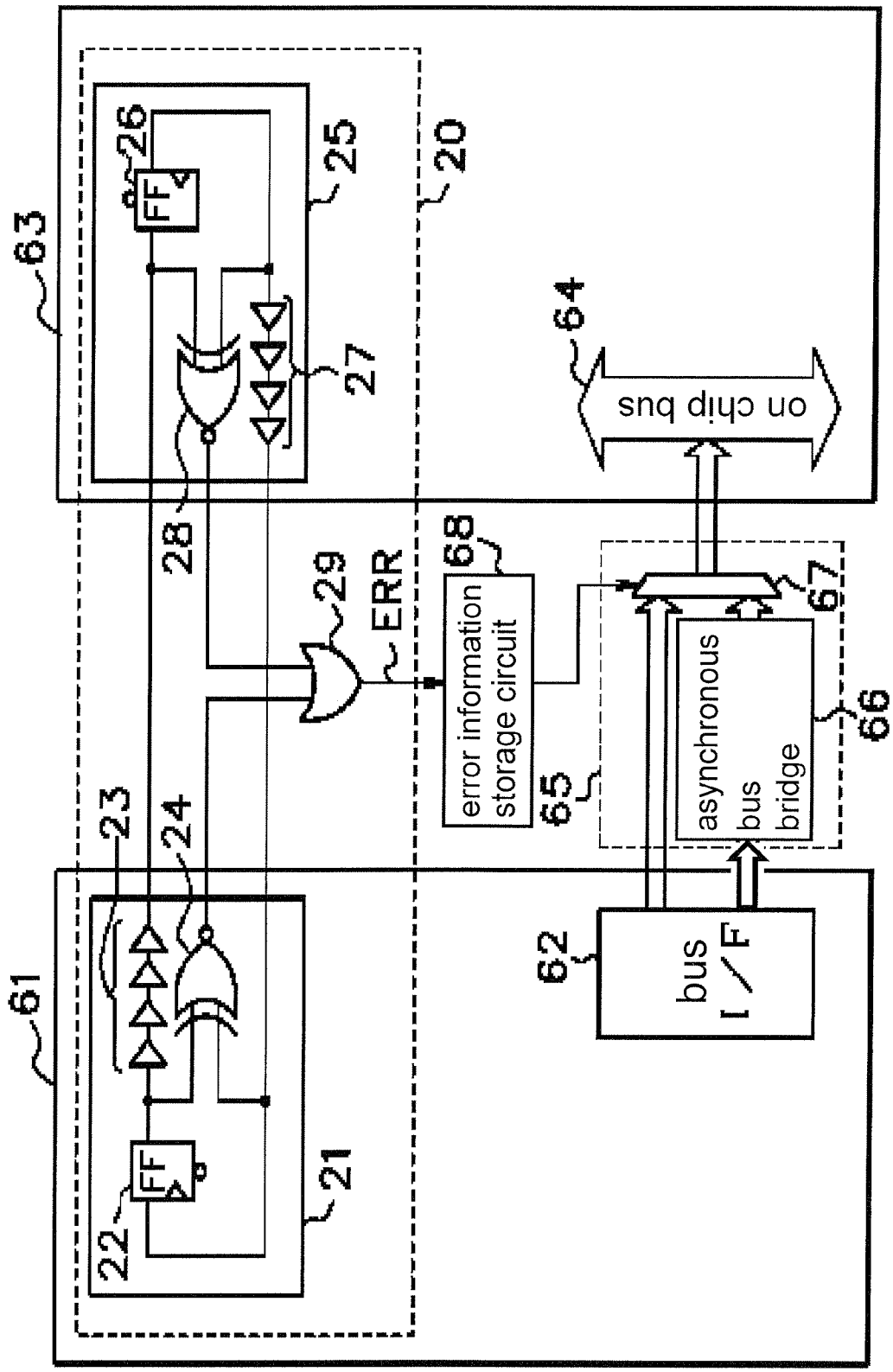
FIG. 4 is a view illustrating an example of a configuration of a semiconductor device according to a second embodiment.

FIG. 4 is a view illustrating an example of a configuration of a semiconductor device according to the second embodiment. In FIG. 4, to structural elements that have the same functions as those in FIG. 2, the same reference numerals are applied and overlapped descriptions are omitted. FIG. 4 illustrates a case where as the malfunction detection circuit 20, the malfunction detection circuit 20 illustrated in FIG. 2 is applied. However, to the malfunction detection circuit 20, the malfunction detection circuit illustrated in FIG. 3 may be applied.

In FIG. 4, a first power source block 61 is, for example, the power source blocks 11 and 12 for realizing the function as the CPU core illustrated in FIG. 1. A second power source block 63 is, for example, the power source block 13 that has the bus (on-chip bus) and the universal peripheral circuit illustrated in FIG. 1.

The first power source block (CPU core) 61 includes the first monitor circuit 21 that forms the malfunction detection circuit 20 and a bus interface circuit 62. The second power source block (bus universal peripheral circuit) 63 includes the second monitor circuit 25 that forms the malfunction detection circuit 20 and an on-chip bus 64. Data transfer between the bus interface circuit 62 and the on-chip bus 64 is performed via a synchronous/asynchronous circuit 65.

The synchronous/asynchronous circuit 65 includes an asynchronous bus bridge 66 and a selector 67. The asynchronous bus bridge 66 is used to asynchronously perform (perform by handshake control or the like) the data transfer between the bus interface circuit 62 and the on-chip bus 64. The selector 67, based on an output from an error information storage circuit 68, switches to perform the data transfer between the bus interface circuit 62 and the on-chip bus 64 by synchronous transfer corresponding to a bus protocol or via the asynchronous bus bridge 66.

The error information storage circuit 68 is formed, for example, using a flip-flop. The error information storage circuit 68 stores and outputs an error detection signal ERR output from the error detection signal output circuit 29 in the malfunction detection circuit 20. When the malfunction detection circuit 20 detects that it is a situation that can cause malfunction, the error information storage circuit 68 stores the value of the error detection signal ERR. Further, the error information storage circuit 68 clears the error detection signal ERR being stored after a certain period has passed since a clear processing was instructed by the CPU or the error detection signal ERR from the malfunction detection circuit 20 was negated. The error detection signal ERR being stored may be automatically cleared after a certain period has passed since the value of the error detection signal ERR was stored.

In the semiconductor device illustrated in FIG. 4, it is assumed that the situation that can cause malfunction is not occurred, and a normal operation is being realized. At the time, the error detection signal ERR is negated and the selector 67 in the synchronous/asynchronous circuit 65 is controlled to perform the data transfer between the bus interface circuit 62 and the on-chip bus 64 by synchronous transfer corresponding to a bus protocol.

In such a state, if the malfunction detection circuit 20 detects that it is a situation that can cause malfunction, the error detection signal ERR is asserted. When the error detection signal ERR is stored in the error information storage circuit 68, by the output of the error information storage circuit 68, the selector 67 in the synchronous/asynchronous circuit 65 is switched to perform the data transfer between the bus interface circuit 62 and the on-chip bus 64 by asynchronous transfer via the asynchronous bus bridge 66. In the operation, it is switched to perform the data transfer between the bus interface circuit 62 and the on-chip bus 64 by asynchronous transfer via the asynchronous bus bridge 66, and the malfunction due to instantaneous power-supply noise, voltage reduction, or the like can be prevented.

When the data transfer is switched from the synchronous transfer to the asynchronous transfer, depending on bus protocols, if the switching is performed during bus access, malfunction may be caused. In the bus protocol that can cause malfunction by the switching during the bus access, in switching from the synchronous transfer to the asynchronous transfer, if the bus access is not performed, the switching is immediately performed. If the bus access is being performed, the switching is performed after the bus access is completed. In the case where the switching to the asynchronous transfer is performed after the bus access is completed, malfunction may occur due to bus access performed before the switching. Accordingly, the operation of the data transfer may be appropriately guaranteed by performing a reset operation or the like.

The error detection signal output circuit 29 in the malfunction detection circuit 20, the synchronous/asynchronous circuit 65, and the error information storage circuit 68 may be provided in the first power source block (CPU core) 61 or the second power source block (bus universal peripheral circuit) 63 respectively. Further, the error detection signal output circuit 29 in the malfunction detection circuit 20, the synchronous/asynchronous circuit 65, and the error information storage circuit 68 may be provided in the other power source blocks.

Third Embodiment

Now, a third embodiment is described.

In a semiconductor device according to the third embodiment, if a situation that can cause malfunction is detected in the above-described semiconductor device according to the second embodiment, further, in a period the operation can become unstable due to the occurrence of the situation that can cause malfunction, the semiconductor device is controlled to reduce an operating frequency in a block that operates at a high speed. In the operation, malfunction such as a timing error due to factors such as instantaneous power-supply noise, voltage reduction, or the like can be prevented.

Figure 5:
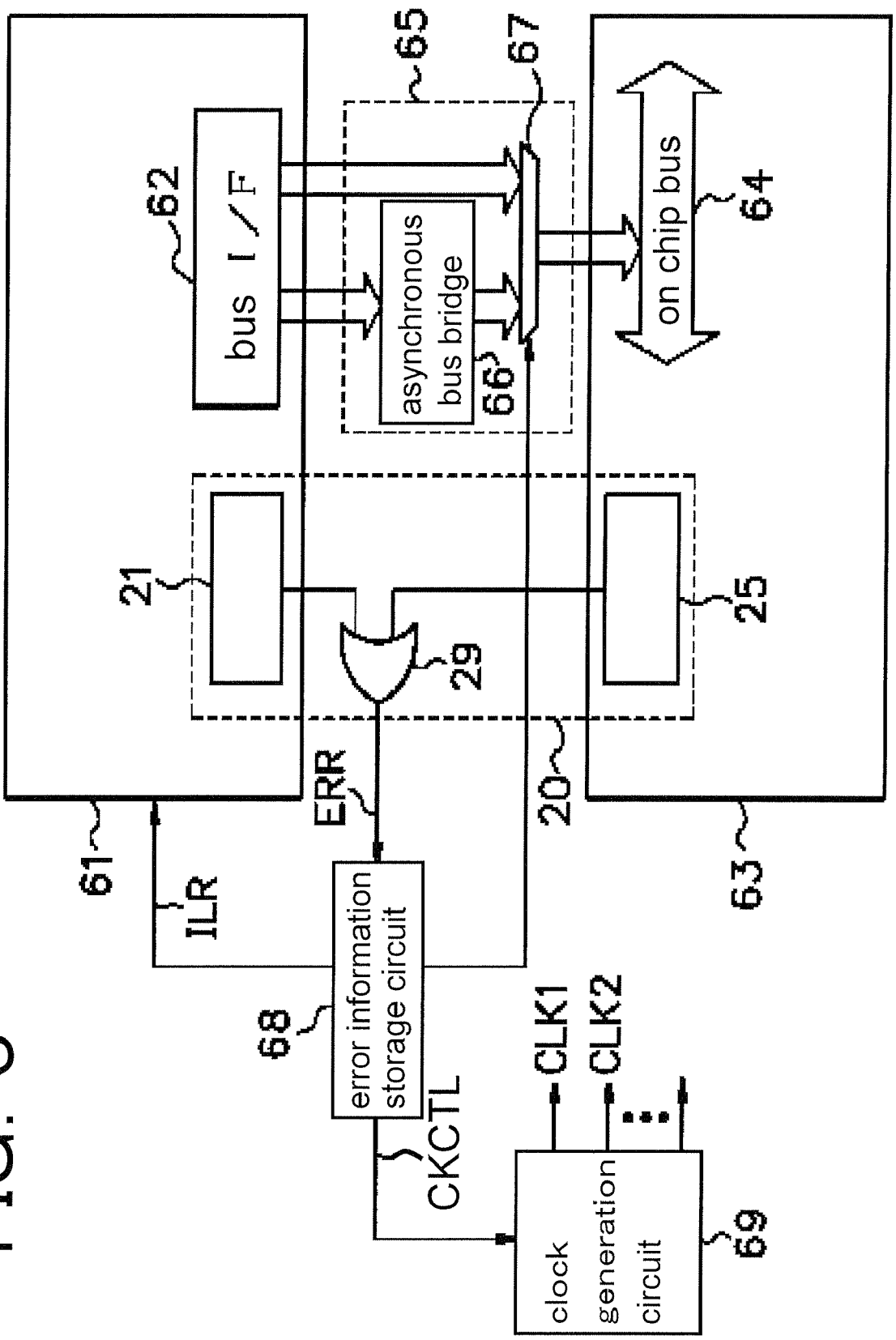
FIG. 5 is a view illustrating an example of a configuration of a semiconductor device according to a third embodiment.

FIG. 5 is a view illustrating an example of a configuration of the semiconductor device according to the third embodiment. In FIG. 5, the same reference numerals are applied to structural elements that have the same functions as those illustrated in FIG. 2 or FIG. 4, and overlapped descriptions are omitted.

In FIG. 5, a clock generation circuit 69 generates clock signals CLK1, CLK2, . . . to be supplied to each block or the like. To the clock generation circuit 69, as a clock control signal CKCTL, an output signal from the error information storage circuit 68 is input. The clock generation circuit 69 generates and outputs the clock signals CLK1, CLK2, . . . corresponding to the input clock control signal CKCTL.

Figure 6:
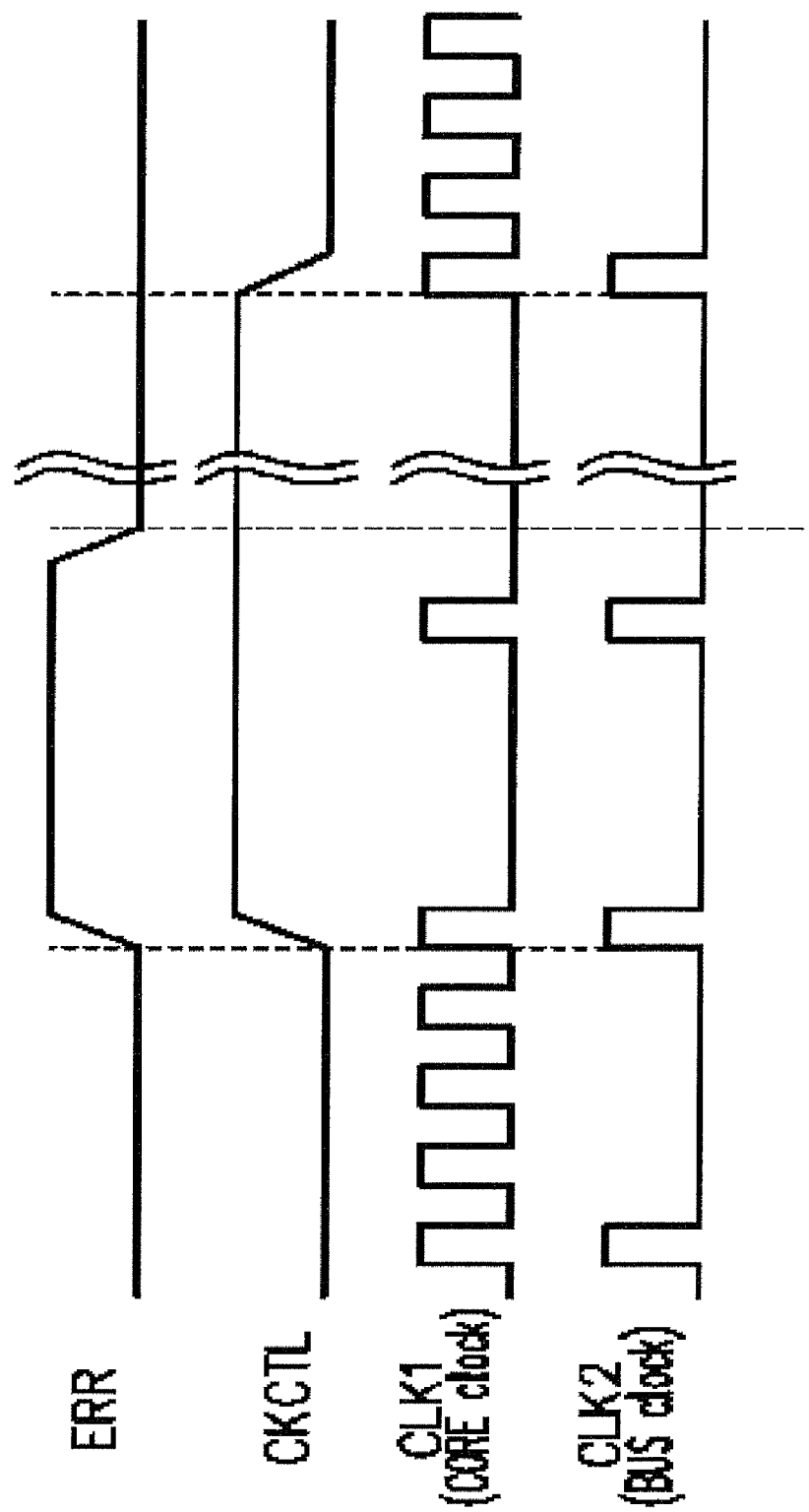
FIG. 6 is a timing chart illustrating an example of an operation of the semiconductor device according to the third embodiment.

With reference to FIG. 6, the example of the operation of the semiconductor device according to the third embodiment illustrated in FIG. 5 is described. FIG. 6 is a timing chart illustrating an example of the operation of the semiconductor device according to the third embodiment. The error detection signal ERR output from the malfunction detection circuit 20 and the clock control signal CKCTL output from the error information storage circuit 68 are at high levels when the signals are asserted, and at low levels when the signals are negated. Further, it is assumed that a clock signal CLK1 generated by the clock generation circuit 69 is a clock signal to be supplied to the CPU core, and a clock signal CLK2 is a clock signal relating to the on-chip bus.

First, it is assumed that as an initial state, both of the error detection signal ERR and the control signal CKCTL are negated. Further, the clock generation circuit 69 generates and outputs the clock signals CLK1 and CLK2 at a normal operation frequency.

If the malfunction detection circuit 20 detects that it is a situation that can cause malfunction, the error signal ERR is asserted. The error detection signal ERR is stored in the error information storage circuit 68, and the clock control signal CKCTL is asserted. If the clock control signal CKCTL is asserted, the clock signal CLK1 to be supplied to a block that operates at a high speed (in this embodiment, the CPU core) is geared down such that an operating frequency of the block is reduced.

After a predetermined time has passed since the error detection signal ERR is negated, the clock control signal CKCTL is negated, and it is controlled that the clock signal CLK1 to be supplied to the block that operates at the high speed is returned.

As described above, in the case where the situation that can cause the timing error due to instantaneous power-supply noise, voltage reduction, or the like, during the period the operation can be unstable, the frequency of the clock signal to supply is controlled to reduce the operating frequency. Accordingly, conditions such as set-up time can be loosened, and the occurrence of the malfunction can be prevented.

It is noted that any methods for gearing down the clock signal CLK1 to be supplied to the block that operates at a high speed can be employed. For example, in a case where a gated clock technique is employed, by controlling using the enable signal, the clock signal may be appropriately masked to reduce the frequency. Further, by controlling a dividing ratio in the clock generation circuit 69, the frequency of the clock signal may be reduced.

Further, similar effect can be obtained instead of gearing down the clock signal CLK1 to be supplied to the block that operates at a high speed by temporarily stopping supplying the clock signal to the block that operates at a high speed while the clock control signal CKCTL is asserted. Further, instead of performing the control relating to the clock signal, as illustrated in FIG. 5, an interlock request signal ILR that is equivalent to the clock control signal CKCTL may be output from the error information storage circuit 68 to the first power source block (CPU core) 61. Then, the interlock request signal ILR may be asserted to temporarily stop the operation of the first power source block. Thus, similarly, the occurrence of the malfunction can be prevented.

Further, in the case where the malfunction detection circuit 20 detects the situation that can cause malfunction, with respect to not only the clock signal to be supplied to the block that operates at the high speed, but also all clock signals to be supplied to each block, the gearing down operation may be performed or the supply may be temporarily stopped.

Fourth Embodiment

Figure 7:
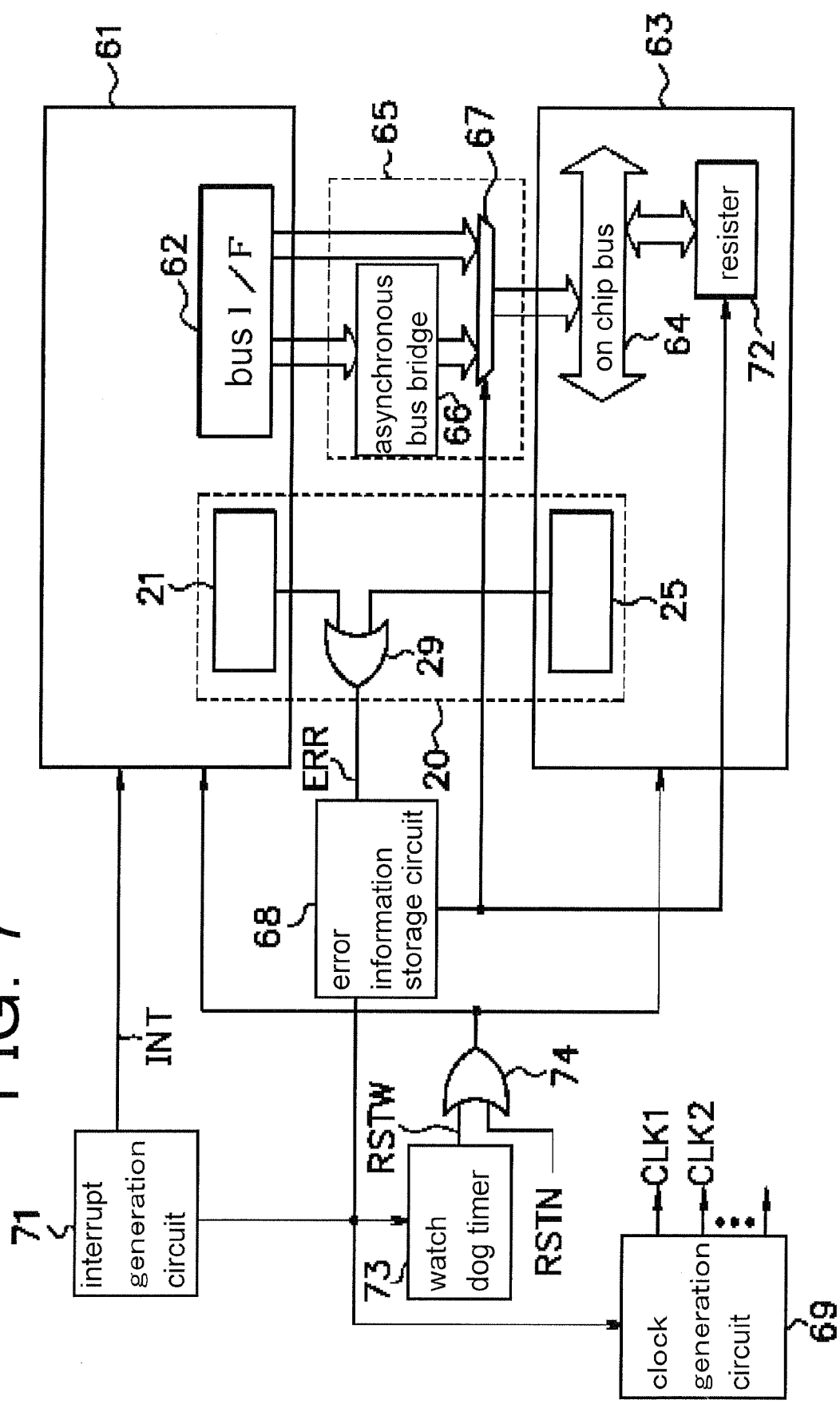
FIG. 7 is a view illustrating an example of a configuration of a semiconductor device according to a fourth embodiment.

A fourth embodiment is described. FIG. 7 is a view illustrating an example of a configuration of a semiconductor device according to the fourth embodiment. In FIG. 7, the same reference numerals are applied to structural elements that have the same functions as those illustrated in FIG. 2, FIG. 4, and FIG. 5 and overlapped descriptions are omitted.

As illustrated in FIG. 7, the semiconductor device according to the fourth embodiment includes an interrupt generation circuit 71, a watch dog timer 73, and an OR circuit 74 in addition to each configuration in the semiconductor device according to the third embodiment illustrated in FIG. 5.

To the interrupt generation circuit 71, an output signal from the error information storage circuit 68 is input. The interrupt generation circuit 71 generates and outputs an interrupt request signal INT to the first power source block (CPU core) 61. If the output signal from the error information storage circuit 68 is asserted in response to an assertion of the error detection signal ERR, the interrupt generation circuit 71 detects the assertion and asserts the interrupt request signal INT. Thus, to software (application) running on the first power source block 61 or the like, it is possible to notify that the occurrence of the situation that can cause malfunction due to instantaneous power-supply noise, voltage reduction, or the like is detected.

The watch dog timer 73 includes a counter, and to the watch dog timer 73, the output signal from the error information storage circuit 68 is input. The watch dog timer 73 outputs a reset signal (watch dog reset) RSTW. The watch dog timer 73 is activated in response to an assertion of the output signal of the error information storage circuit 68 by an assertion of the error detection signal ERR. Further, the watch dog timer 73 asserts the reset signal RSTW in response to a completion of counting of a predetermined count value (if the count value reaches a predetermined value). The watch dog timer 73 is reset by a CPU instruction. If the first power source block (CPU core) 61 is not hang up, in response to an assertion of the interrupt request signal INT, the watch dog timer 73 is reset.

To the OR circuit 74, a normal reset signal RSTN and the reset signal RSTW from the watch dog timer 73 are input. The OR circuit 74 implements a logical OR operation, and outputs the operation result to the first and second power source blocks 61 and 63 as reset signals.

The second power source block 63 includes an error monitor register 72. The error monitor register 72 stores error information (locations errors are detected, the number of the detections, factors of the effort generation, etc.) in response to an instruction from the error information storage circuit 68. In FIG. 7, the error monitor register 72 is connected to the on-chip bus 64. However, it is not limited to the above, but the error monitor register 72 may be read by the clock generation circuit 69, the first power source block (CPU core) 61, or the like.

As described above, according to the fourth embodiment, in the case where the occurrence of the situation that can cause malfunction is detected by the malfunction detection circuit 20 and the output signal from the error information storage circuit 68 is asserted, the watch dog timer 73 is activated, and the interrupt request signal INT to be output to the first power source block (CPU core) 61 is asserted. Accordingly, if malfunction has already occurred due to instantaneous power-supply noise, voltage reduction, or the like, the recovery operation can be performed.

That is, in a case where the first power source block (CPU core) 61 malfunctions and hang up, using the reset signal RSTW from the watch dog timer 73, circuits including the first power source block (CPU core) 61 can be reset, and the recovery processing can be performed. At the time, if the error monitor register 72 is not initialized and the stored error information can be read by the first power source block (CPU core) 61, the recovery processing (for example, recovery processing such as returning by a low-speed clock signal) appropriate for the error information can be performed. The initialization of the error monitor register 72 can be performed by a write operation from the first power source block (CPU core) 61, a reset operation such as a power-on reset different from the reset signal RSTW, or the like.

Fifth Embodiment

Fifth embodiment is described. In a semiconductor device according to the fifth embodiment, in the above-described semiconductor device according to the fourth embodiment, occurrence of a situation that can cause malfunction is detected based on a change in power supply potentials supplied to the first and second power source blocks.

Figure 8:
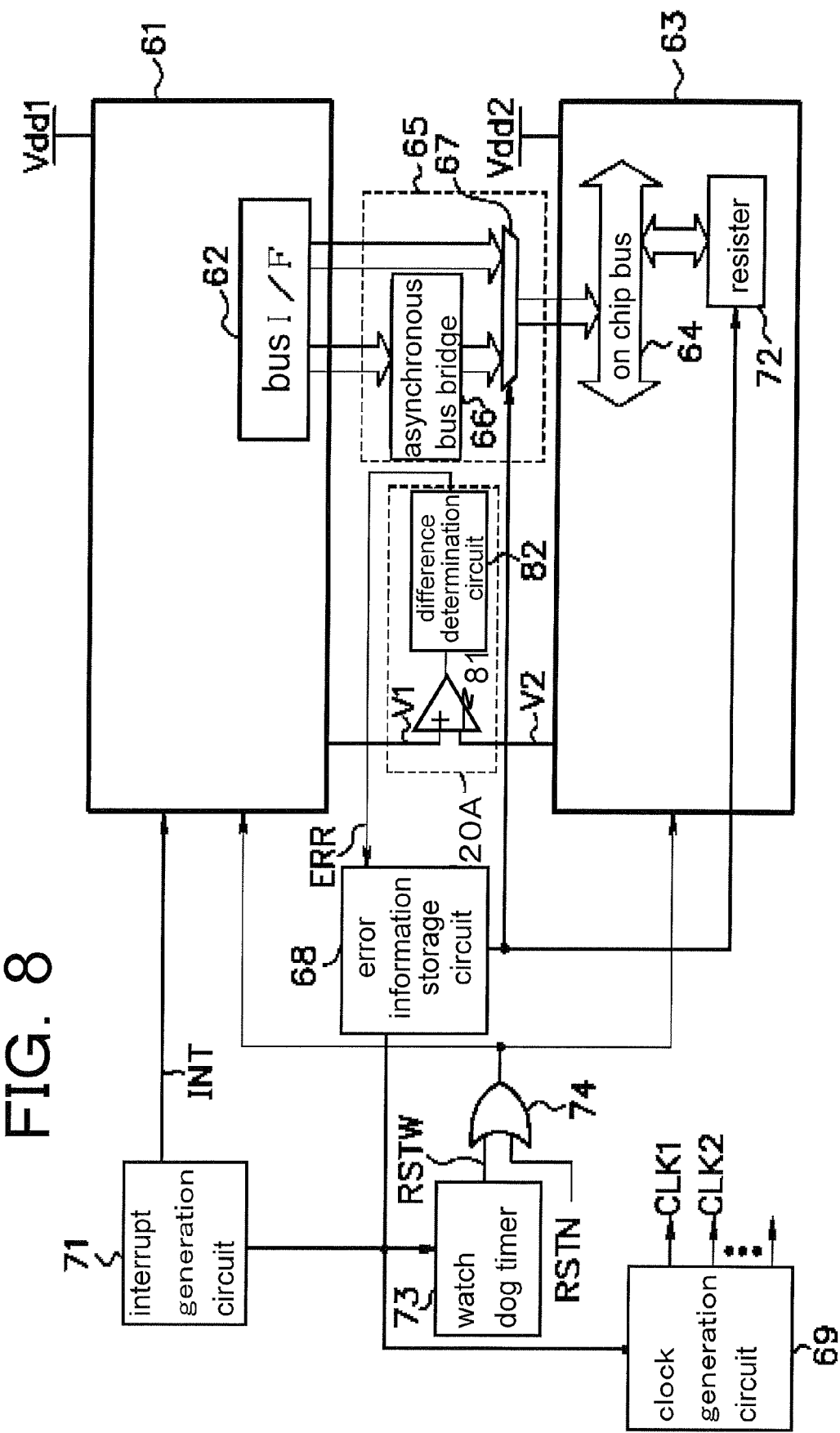
FIG. 8 is a view illustrating an example of a configuration of a semiconductor device according to a fifth embodiment.

FIG. 8 is a view illustrating an example of a configuration of the semiconductor device according to the fifth embodiment. In FIG. 8, the same reference numerals are applied to structural elements that have the same functions as those illustrated in FIG. 2, FIG. 4, FIG. 5, and FIG. 7 and overlapped descriptions are omitted.

In FIG. 8, reference numeral 20A denotes a malfunction detection circuit. The malfunction detection circuit 20A includes a potential difference detection circuit 81 and a potential difference determination circuit 82. To the potential difference detection circuit 81, a potential V1 corresponding to a power supply potential Vdd1 that is supplied to the first power source block 61 and a potential V2 corresponding to a power supply potential Vdd2 that is supplied to the second power source block 63 are input. The potential difference detection circuit 81 detects a potential difference between the potential voltage V1 and the potential voltage V2 and outputs a signal corresponding to the detection result to the potential difference determination circuit 82. The potential difference determination circuit 82 determines whether the potential difference between the potential voltage V1 and the potential voltage V2 exceeds a predetermined range, that is, a situation that can cause malfunction, based on the signal corresponding to the detection result from the potential difference detection circuit 81. As a result, if the potential difference between the potential voltage V1 and the potential voltage V2 exceeds the predetermined range, the potential difference determination circuit 82 asserts an error detection signal ERR.

As described above, according to the fifth embodiment, based on the change in the differences between the power supply potentials supplied to the first and second power source blocks respectively, the situation that can cause malfunction can be detected.

Then, similar effects to those in each of the above-described embodiments can be obtained.

A sixth embodiment is described. In a circuit that uses a phase locked loop (PLL) or a delay locked loop (DLL), when power-supply noise, voltage reduction, or the like occurs for some reason, the circuit use unlocked and a frequency of an output clock may be transiently increased to a high frequency. Thus, the frequency of the clock signal supplied to the circuit may become too high and may cause malfunction.

To solve the problem, in the semiconductor device according to the sixth embodiment, as a malfunction detection circuit, an output signal from a lock terminal of the PLL or the DLL is monitored. If the malfunction detection circuit detects that the circuit is unlocked, in a period the operation may become unstable, the frequency of the clock signal to be supplied is controlled to be a low frequency. Thus, malfunction due to power-supply noise, voltage reduction, or the like can be prevented.

Figure 9:
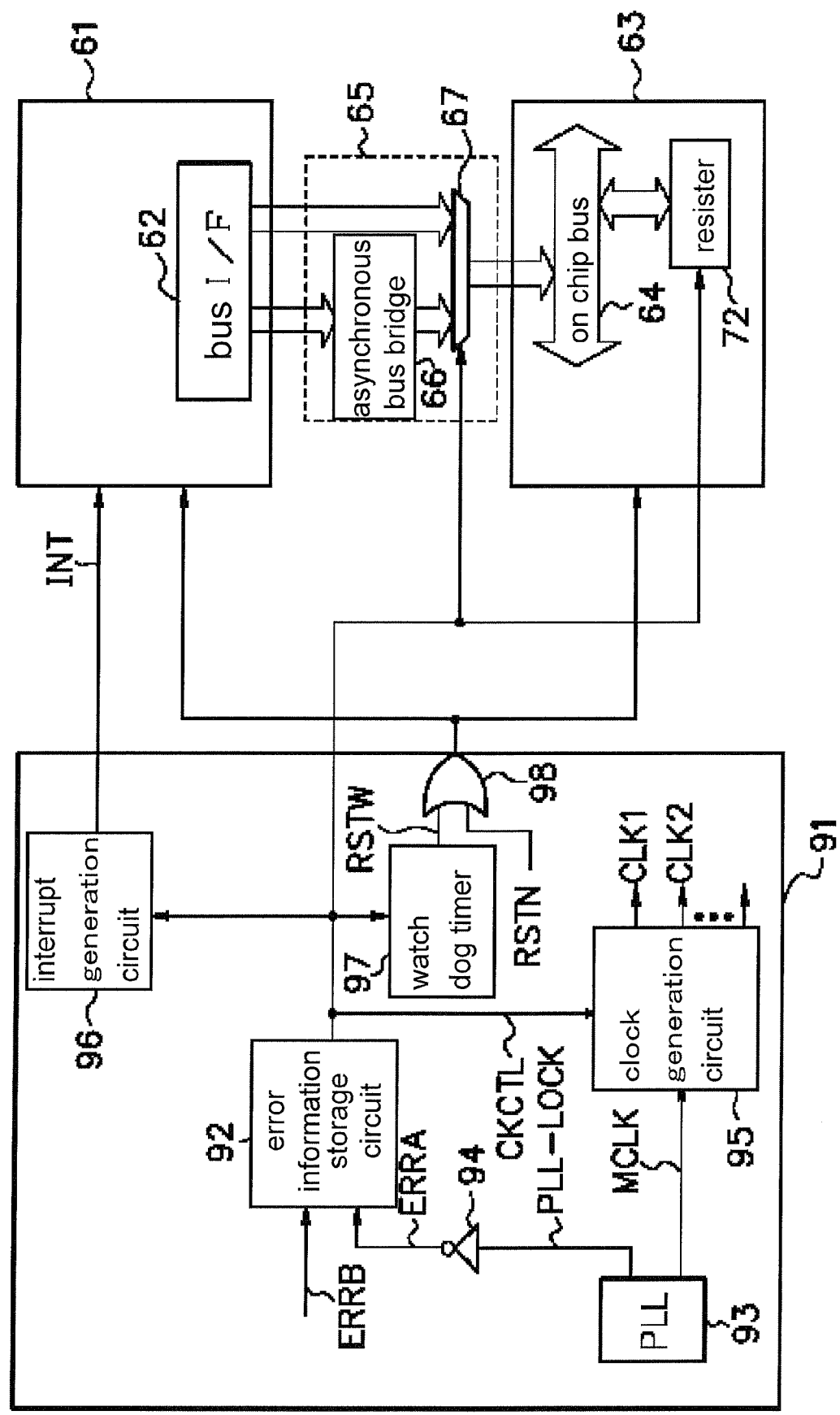
FIG. 9 is a view illustrating an example of a configuration of a semiconductor device according to a sixth embodiment.

FIG. 9 is a view illustrating an example of a configuration of the semiconductor device according to the sixth embodiment. In FIG. 9, the same reference numerals are applied to structural elements that have the same functions as those illustrated in FIG. 4 and overlapped descriptions are omitted.

In FIG. 9, reference numeral 91 denotes a third power source block. The third power source block 91 includes an error information storage circuit 92, a PLL 93, an inverter 94, a clock generation circuit 95, an interrupt generation circuit 96, a watch dog timer 97, and an OR circuit 90. The error information storage circuit 92 corresponds to the error information storage circuit 68, and stores and outputs error detection signals ERRA and ERRB.

The PLL 93 outputs a master clock MCLK to the clock generation circuit 95. Further, the PLL 93 outputs a signal that indicates whether the PLL 93 is locked or not as an output signal PLL-LOCK from a lock terminal. At a stable state (the PLL 93 is locked), the output signal PLL-LOCK is asserted at a high level, and at an unstable state (the PLL 93 is unlocked), the output signal PLL-LOCK is negated at a low level. The output signal PLL-LOCK from the PLL 93 is supplied as the error detection signal ERRA to the error information storage circuit 92 via the inverter 94.

The clock generation circuit 95 corresponds to the clock generation circuit 69, and generates clock signals CLK1, CLK2, . . . that are supplied to each block or the like. To the clock generation circuit 95, an output signal from the error information storage circuit 92 is input as a clock control signal CKCTL. The clock generation circuit 95 generates the clock signals CLK1, CLK2, . . . that correspond to the output signal based on the master clock MCLK received from the PLL 93.

The interrupt generation circuit 96 corresponds to the interrupt generation circuit 71, and to the interrupt generation circuit 96, the output signal from the error information storage circuit 92 is input. The interrupt generation circuit 96 generates an interrupt request signal INT and outputs the signal to the first power source blocks (CPU core) 61. The watch dog timer 97 corresponds to the watch dog timer 73, and to the watch dog timer 97, the output signal from the error information storage circuit 92 is input. The watch dog timer 97 outputs a reset signal (watch dog reset) RSTW. The OR circuit 98 corresponds to the OR circuit 74. The OR circuit 98 implements a logical OR operation between a normal reset signal RSTN and a reset signal RSTW, and outputs an operation result as a reset signal to the first and second power source blocks 61 and 63.

Figure 10:
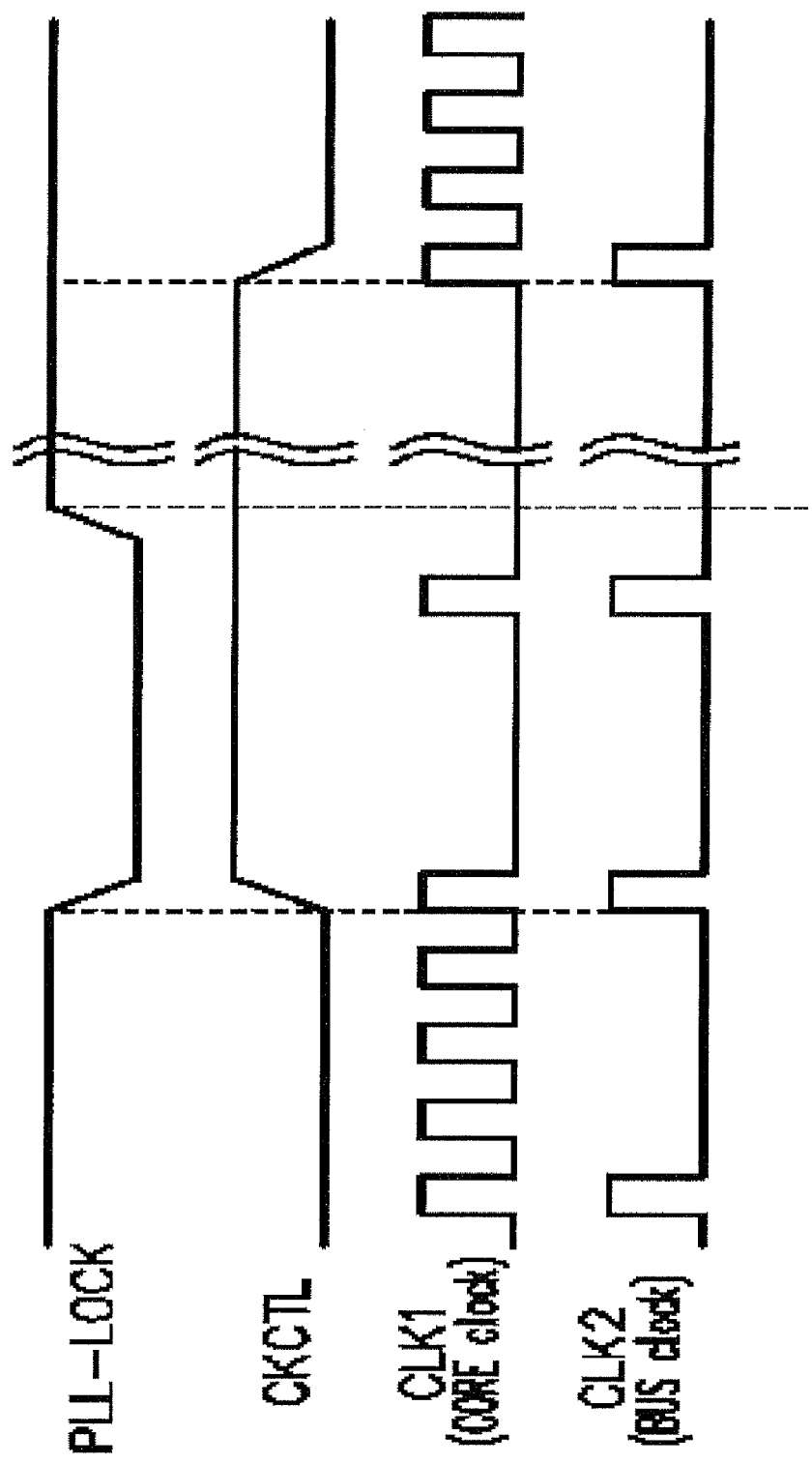
FIG. 10 is a timing chart illustrating an example of an operation of the semiconductor device according to the sixth embodiment.

An example of the operation of the semiconductor device according to the sixth embodiment illustrated in FIG. 9 is described with reference to FIG. 10. FIG. 10 is a timing chart illustrating an example of the operation of the semiconductor device according to the sixth embodiment. It is assumed that the clock signal CLK1 generated by the clock generation signal 95 is a clock signal supplied to the CPU core, and the clock signal CLK2 is a clock signal relating to the on-chip bus.

First, as an initial state, it is assumed that the output signal PLL-LOCK form the PLL 93 is asserted, that is, the error detection signal ERRA is negated, and the clock control signal CKCTL is negated. The clock generation circuit 95 generates and outputs the clock signals CLK1 and CLK2 at frequencies at a normal operation.

If the PLL 93 is unlocked due to power-supply noise, voltage reduction, or the like, the output signal PLL-LOCK is negated. In response to the negation of the output signal PLL-LOCK, the error detection signal ERRA is asserted. The error detection signal ERRA is stored in the error information storage circuit 68, and the clock control signal CKCTL is asserted. In response to the assertion of the clock control signal CKCTL, similarly to the third embodiment, a clock signal to be supplied to a block is geared down to reduce the operating frequency (in the example illustrated in FIG. 10, the clock signal CLK1 to be supplied to the CPU core is geared down).

Then, if the PLL 93 is locked again, the output signal PLL-LOCK is asserted. After a predetermined period has passed, the clock control signal CKCTL is negated and a control is performed to return the clock signal CLK1.

As described above, in the case where the PLL 93 is unlocked due to power-supply noise, voltage reduction, or the like and malfunction can be caused, in the period the operation may become unstable, the frequency of the clock signal to supply is controlled to become a low operating frequency. Thus, occurrence of malfunction can be prevented. In the above-described description, when the PLL 93 is unlocked, only the clock signal CLK1 to be supplied to the CPU core is geared down. However, all clock signals to be supplied to each block may be geared down.

Further, in a case where an interrupt due to reduction in an external battery supply voltage or the like, an interrupt due to increase in temperatures in the chip due to change in the operation environment or the like is provided, the interrupt can be recognized as an error detection signal ERRB. Then, by performing clock gear down, generation of an interrupt request signal INT, activation of the watch dog timer 97, or the like, the occurrence of malfunction due to the reduction in the battery supply voltage or the increase in temperatures in the chip can be prevented.

Similarly to the fourth and fifth embodiments, in the case where the error detection signal ERRA or the error detection signal ERRB is asserted, the watch dog timer 97 may be activated while the interrupt request INT to the first power source block (CPU core) 61 is asserted. Thus, if the first power source block (CPU core) 61 is hang up due to malfunction, it is possible to appropriately perform the recovery processing.

Figure 11:
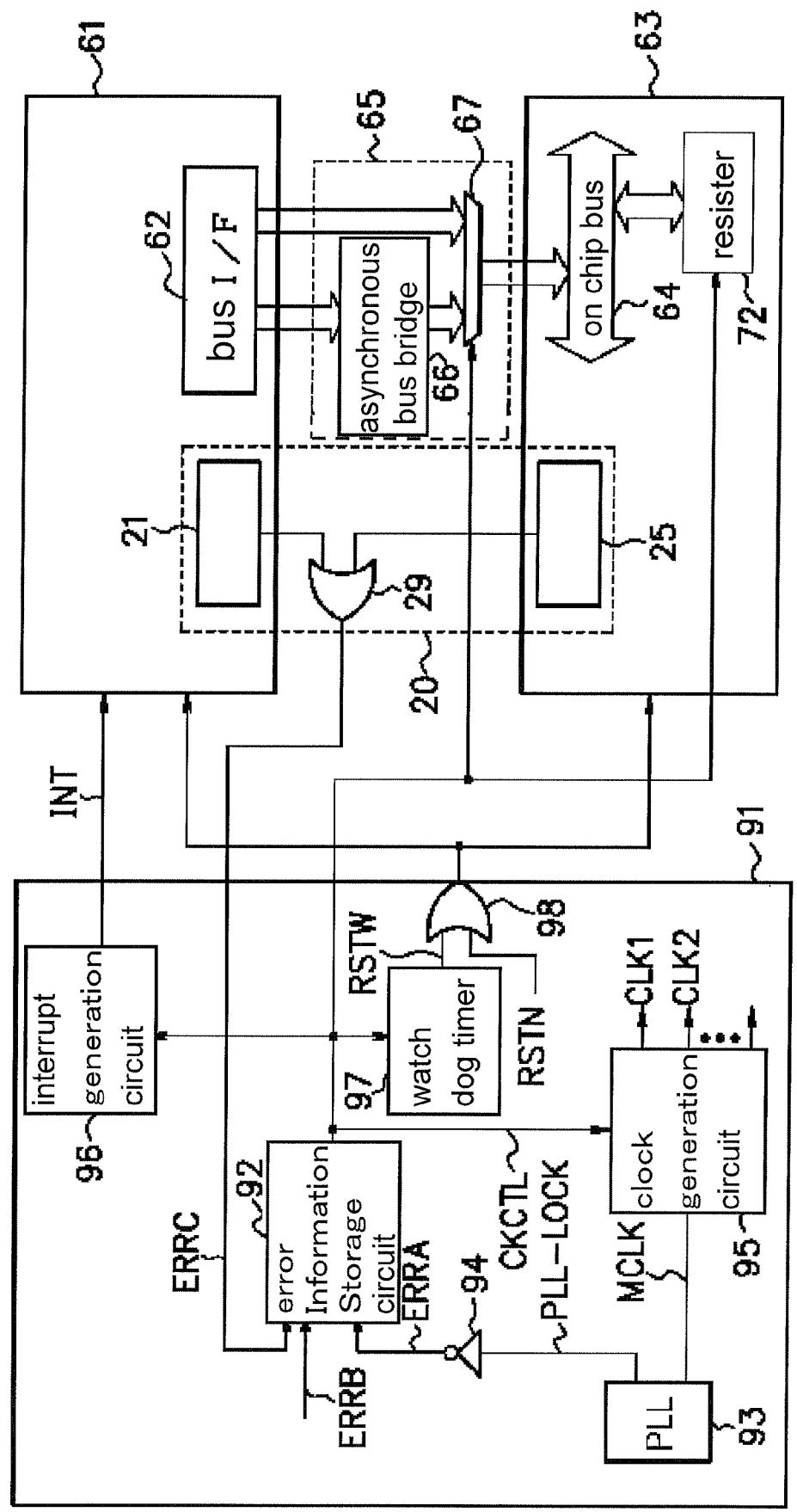
FIG. 11 is a view illustrating an another example of the configuration of the semiconductor device according to the sixth embodiment.

FIG. 11 is a view illustrating another example of the configuration of the semiconductor device according to the sixth embodiment. In FIG. 11, the same reference numerals are applied to structural elements that have the same functions as those illustrated in FIG. 2, FIG. 4, FIG. 5, FIG. 7, and FIG. 9, and overlapped descriptions are omitted.

The semiconductor device illustrated in FIG. 11 includes, in addition to the semiconductor device according to the six embodiment illustrated in FIG. 9, the malfunction detection circuit 20 illustrated in FIG. 2. An output signal from the malfunction detection circuit 20 is supplied to the error information storage circuit 92 as an error detection signal ERRC. In FIG. 11, to the malfunction detection circuit 20, the malfunction detection circuit illustrated in FIG. 2 is applied, however, the malfunction detection circuit illustrated in FIG. 3 may be applied.

Seventh Embodiment

A seventh embodiment is described. In the seventh embodiment, the chip includes a plurality of power source blocks that include circuits for realizing the function as the CPU core. In a case where a malfunction detection circuit detects a situation that can cause malfunction due to power-supply noise, voltage reduction, or the like, an interrupt request is issued to the power source blocks that function as the CPU core, and states of each power source block are checked by communication (CPU communication) between the power source blocks that function as the CPU core or the like. Among the power source blocks that function as the CPU core, a normally operating power source block or a power source block that performs electric power control or the like controls an operating frequency and an operating voltage. Thus, the control that enables safer operation can be performed.

Figure 12:
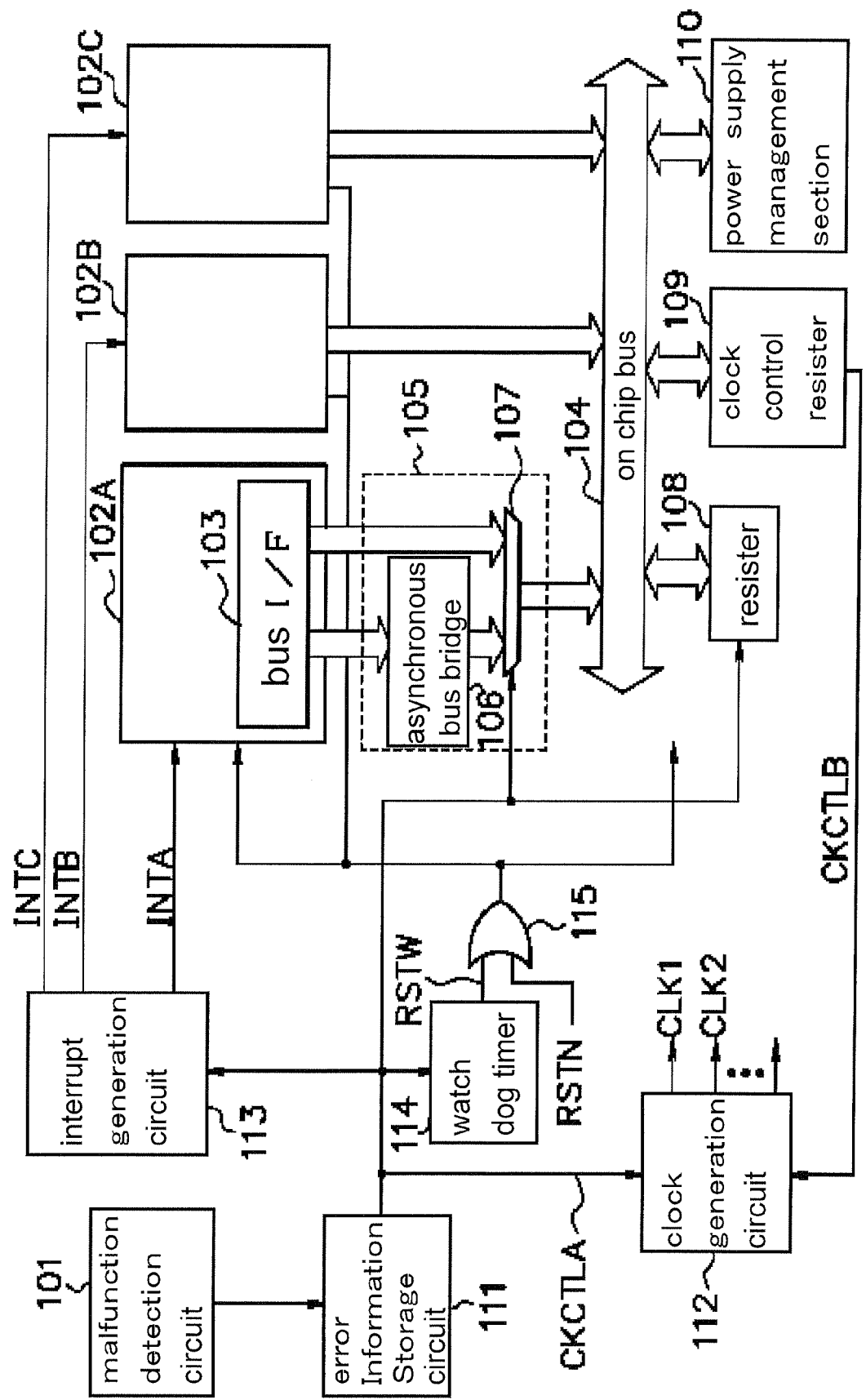
FIG. 12 is a view illustrating an example of a configuration of a semiconductor device according to a seventh embodiment.
Figure 13:
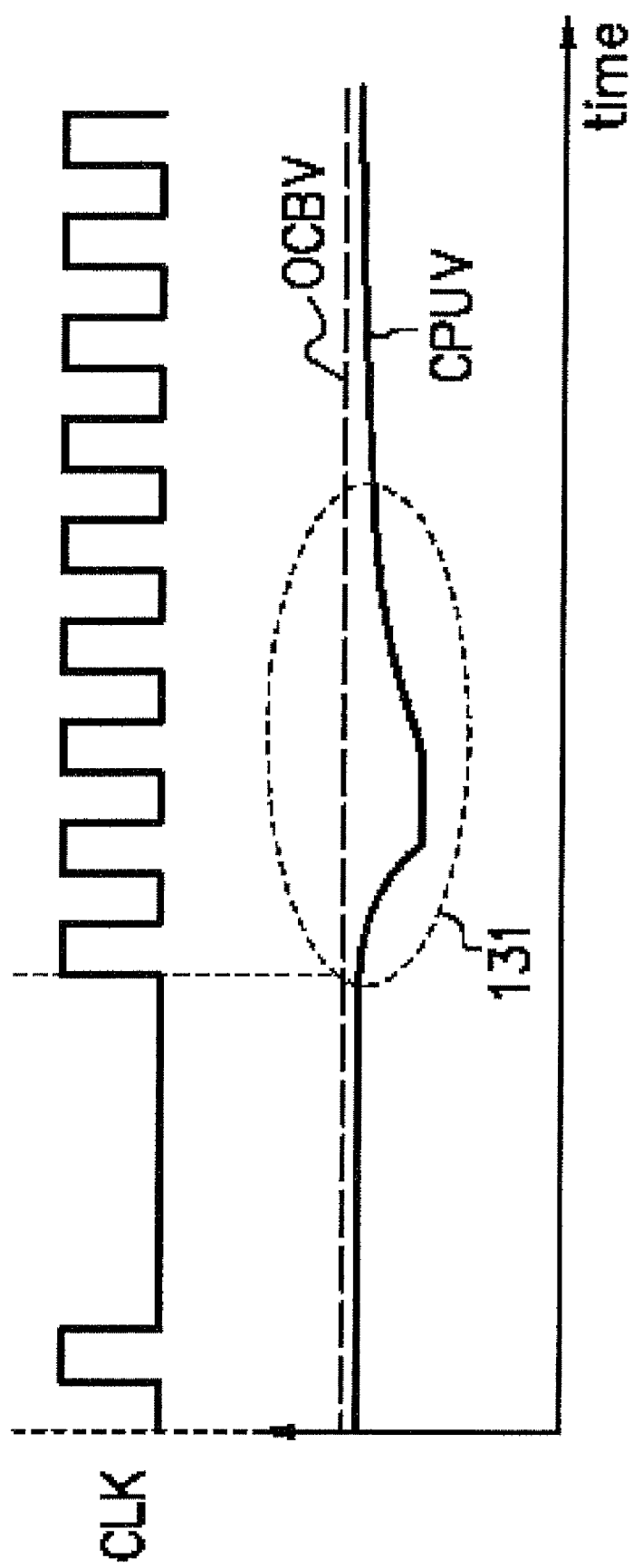
FIG. 13 is a view illustrating an example of inner voltage variation in a semiconductor device.

FIG. 12 is a view illustrating an example of the configuration of the semiconductor device according to the seventh embodiment. The semiconductor device according to the seventh embodiment includes the power source blocks that have circuits for realizing the CPU core in the chip.

As illustrated in FIG. 12, the semiconductor device according to the seventh embodiment includes a malfunction detection circuit 101, power source blocks 102A, 102B, and 102C that realize the function of the CPU core, an on-chip bus 104, a synchronous/asynchronous selection circuit 105, an error monitor register 108, a clock control register 109, a power supply management section 110, an error information storage circuit 111, a clock generation circuit 112, an interrupt generation circuit 113, a watch dog timer 114, and an OR circuit 115.

The malfunction detection circuit 101 detect an occurrence of a situation that can cause malfunction. To the malfunction detection circuit 101, the above-described malfunction detection circuit 20 illustrated in FIGS. 2 and 3, the malfunction detection circuit 20A illustrated in FIG. 8, the circuits that monitor the output signal from the lock terminal of the PLL or the DLL or the like can be applied. In FIG. 12, for the sake of simplicity, the above-described malfunction detection circuits are generically illustrated as one malfunction detection circuit 101.

The power source blocks 102A, 102B, and 102C include circuits for realizing the function as the CPU core respectively. In FIG. 12, only the power source block 102A is specifically illustrated and the power source blocks 102B and 102C are simplified. However, the power source blocks 102A to 102C are similarly configured.

The power source blocks 102A, 102B, and 102C include bus interface circuit sections 103, and transfer data between the bus interface circuit sections 103 and the on-chip bus 104 via the synchronous/asynchronous selection circuit 105 respectively. The bus interface circuit sections 103, the on-chip bus 104, and the synchronous/asynchronous selection circuit 105 (an asynchronous bus bridge 106, a selector 107) correspond to the bus interface circuit section 62, the on-chip bus 64, and the synchronous/asynchronous selection circuit 65 (the asynchronous bus bridge 66, the selector 67) illustrated in FIG. 4 or the like respectively, and the elements are similarly configured.

To the on-chip bus 104, the error monitor register 108 that stores error information (locations errors are detected, the number of the detections, factors of the effort generation, etc.) in response to an instruction from the error information storage circuit 111 that corresponds to the error monitor register 72, the clock control register 109 that stores information about clock control, and the power supply management section 110 that performs an electric power supply management.

The error information storage circuit 111, the clock generation circuit 112, the interrupt generation circuit 113, the watch dog timer 114, and the OR circuit 115 correspond to the error information storage circuit 68, the clock generation circuit 69, the interrupt generation circuit 71, the watch dog timer 73, and the OR circuit 74 illustrated in FIGS. 5 and 7 respectively, and the elements are similarly configured.

However, in the seventh embodiment, to the clock generation circuit 112, an output signal form the error information storage circuit 111 is input as a clock control signal CKCTLA and a clock control signal CLCTLB is input from the clock control register. The clock generation circuit 112 generates and outputs clock signals CLK1, CLK2, . . . in response to the input clock control signals CKCTLA and CLCTLB.

The interrupt generation circuit 113 according to the seventh embodiment outputs interrupt request signals INTA, INTB, and INTC to the power source blocks (CPU cores) 102A to 102C that function as the CPU core respectively. In response to an assertion of the output signal from the error information storage circuit 111, the interrupt generation circuit 113 detects the assertion, and asserts the interrupt request signals INTA, INTB, and INTC.

Thus, in the case where the malfunction detection circuit 101 detects the occurrence of the situation that can cause malfunction due to power-supply noise, voltage reduction, or the like, the interrupt request is preformed by issuing the interrupt request signals INTA, INTB, and INTC to the power source blocks 102A to 102C respectively. Then, by the communication between the power source blocks 102A to 102C, or the like, the states of each power source block can be checked with each other. Using a normally operating power source block or a power source block that performs electric power control or the like, by controlling an operating frequency and an operating voltage, safer operation can be realized.

Similarly to the above-described embodiments, in the case where the occurrence of the situation that can cause malfunction is detected, the detection is recognized as the error detection signal. Then, by performing the clock gear down, the generation of the interrupt request signal, the activation of the watch dog timer, or the like, the occurrence of the malfunction can be prevented. Further, if the power source blocks 102A to 102C are hang up due to malfunction, it is possible to appropriately perform the recovery processing.

Although the embodiments have been described, it is to be understood that the embodiments are a part of embodiments to implement the present invention, and should not be construed as limiting the technical scope of the present invention. That is, various modifications can be made without departing from the technical ideas or primary characteristics of the invention.

What is claimed is:

1. A semiconductor device having a plurality of power source blocks including a power source block that can control operating frequencies and operating voltages, the semiconductor device comprising:
   a first memory circuit being disposed in a first power source block and operating in synchronization with a clock;
   a second memory circuit being disposed in a second power source block and operating in synchronization with the clock;
   a first delay circuit being connected between an output terminal of the first memory circuit and an input terminal of the second memory circuit;
   a second delay circuit being connected between an output terminal of the second memory circuit and an input terminal of the first memory circuit; and
   a determination circuit determining whether it is a situation that can cause malfunction based on an input signal and an output signal in the first and second memory circuits and outputting a determination result as an error detection signal.

2. The semiconductor device according to claim 1, wherein the semiconductor device has a plurality of sets of the first memory circuit, the second memory circuit, the first delay circuit, and the second delay circuit;
   a plurality of circuit elements forming the first delay circuit is disposed in the first power source block, and a plurality of circuit elements forming the second delay circuit is disposed in the second power source block; and
   a plurality of circuit elements forming the first delay circuit and a plurality of circuit elements forming the second delay circuit are disposed in different arrangements respectively in the first power source block and the second power source block.

3. The semiconductor device according to claim 1, wherein the first and second memory circuits are flip-flops respectively, and the first and second delay circuits are serially-connected buffers or an even number of inverters respectively.

4. The semiconductor device according to claim 1, the semiconductor device further comprising:
   a PLL circuit and/or a DLL circuit,
   wherein the determination circuit determines whether an output clock of the PLL circuit and/or the DLL circuit are/is stable or not based on an output signal from the PLL circuit and/or the DLL circuit, and outputs an error detection signal indicating if they/it are/is a situation that can cause malfunction or not based on a determination result.

5. The semiconductor device according to claim 1, the semiconductor device further comprising:
   a selection circuit for switching to perform data transfer in synchronous transfer or in asynchronous transfer based on the error detection signal output from the determination circuit.

6. The semiconductor device according to claim 1, wherein based on the error detection signal output from the determination circuit, at least one of an operating voltage and an operating frequency in at least one of the first power source block and the second power source block is controlled.

7. The semiconductor device according to claim 1, wherein an operating frequency in at least one of the first power source block and the second power source block is reduced in a case where a detection of the situation that can cause malfunction is notified by the error detection signal.

8. The semiconductor device according to claim 1, wherein a frequency of a clock signal to be supplied is reduced or supply of the clock signal is temporarily stopped with respect to at least one of the first power source block and the second power source block in a case where a detection of the situation that can cause malfunction is notified by the error detection signal.

9. The semiconductor device according to claim 1, wherein an operation of at least one of the first power source block and the second power source block is temporarily stopped in a case where a detection of the situation that can cause malfunction is notified by the error detection signal.

10. The semiconductor device according to claim 1, the semiconductor device further comprising:
   a reset generation circuit including a counter; and
   an interrupt generation circuit for generating an interrupt request to at least one of the first power source block and the second power source block,
   wherein in a case where a detection of the situation that can cause malfunction is notified by the error detection signal, the reset generation circuit performs a count operation, and the interrupt generation circuit generates the interrupt request, and in a case where a clear operation of a count value corresponding to the interrupt request is not implemented by the time the count value in the reset generation circuit reaches to a predetermined value, the reset generation circuit initializes the first power source block and the second power source block.

* * * * *